(12) United States Patent
Ketonen

(10) Patent No.: US 11,656,253 B2
(45) Date of Patent: May 23, 2023

(54) TEMPERATURE COMPENSATION CIRCUIT IN A VOLTAGE MEASUREMENT

(71) Applicant: Beamex Oy Ab, Pietarsaari (FI)

(72) Inventor: Hannu Ketonen, Pietarsaari (FI)

(73) Assignee: BEAMEX OY AB, Pietarsaari (FI)

( * ) Notice: Subject to any disclaimer, the term of this patent is extended or adjusted under 35 U.S.C. 154(b) by 0 days.

(21) Appl. No.: 17/556,245

(22) Filed: Dec. 20, 2021

(65) Prior Publication Data

US 2022/0196712 A1 Jun. 23, 2022

(30) Foreign Application Priority Data

Dec. 22, 2020 (FI) ...................................... 20206363

(51) Int. Cl.
| | | |
|---|---|---|
| *G01R 19/32* | (2006.01) | |
| *G01R 19/25* | (2006.01) | |
| *G01R 15/04* | (2006.01) | |

(52) U.S. Cl.
CPC ............. *G01R 19/32* (2013.01); *G01R 15/04* (2013.01); *G01R 19/2506* (2013.01)

(58) Field of Classification Search
CPC .......... G01R 1/44; G01R 15/00; G01R 15/04; G01R 19/00; G01R 19/0084; G01R 19/25; G01R 19/2506; G01R 19/32
See application file for complete search history.

(56) References Cited

U.S. PATENT DOCUMENTS

| | | | |
|---|---|---|---|
| 4,363,243 A | 12/1982 | Poff | |
| 4,868,909 A * | 9/1989 | Lowel | ................... G01D 5/145 |
| | | | 324/252 |
| 5,926,778 A | 7/1999 | Pöppel | |
| 2005/0248351 A1 | 11/2005 | Graf | |
| 2012/0120987 A1* | 5/2012 | Torti | ........................ G01K 7/25 |
| | | | 374/E7.018 |
| 2013/0002234 A1 | 1/2013 | Marten | |
| 2019/0383685 A1* | 12/2019 | Kim | ..................... G01L 27/005 |
| 2020/0106453 A1 | 4/2020 | Fritz et al. | |

OTHER PUBLICATIONS

European Search Report for EP Application No. 21215154.2 dated Jun. 2, 2022 (5 pages).
Finnish Search Report for FI Application No. 20206363 dated Aug. 16, 2021 (2 pages).
Beyshlag, "Increasing Accuracy in Feedback Circuits and Voltage Dividers with Thin Film Chip Resistor Arrays," 2012, https://www.vishay.com/docs/28194/increasrr.pdf (4 pages).

\* cited by examiner

*Primary Examiner* — Huy Q Phan
*Assistant Examiner* — David B Frederiksen
(74) *Attorney, Agent, or Firm* — Merchant & Gould P.C.

(57) ABSTRACT

A method of determining a high voltage value without measuring the high voltage value directly, in varying possible temperatures. An apparatus includes two voltage divider circuits (108, 110; 109, 111), wherein the second circuit (i.e. a reference circuit 109, 111) is provided with a smaller reference input voltage (102). The transfer ratio can be obtained from the reference circuit (109, 111) through voltage measurements, and deduced into a transfer ratio of another circuit (108, 110), no matter the ambient temperature value. When measuring a divided voltage value (103) of one circuit (108, 110), the desired high voltage value (101) can be calculated, no matter what the ambient temperature is.

10 Claims, 1 Drawing Sheet

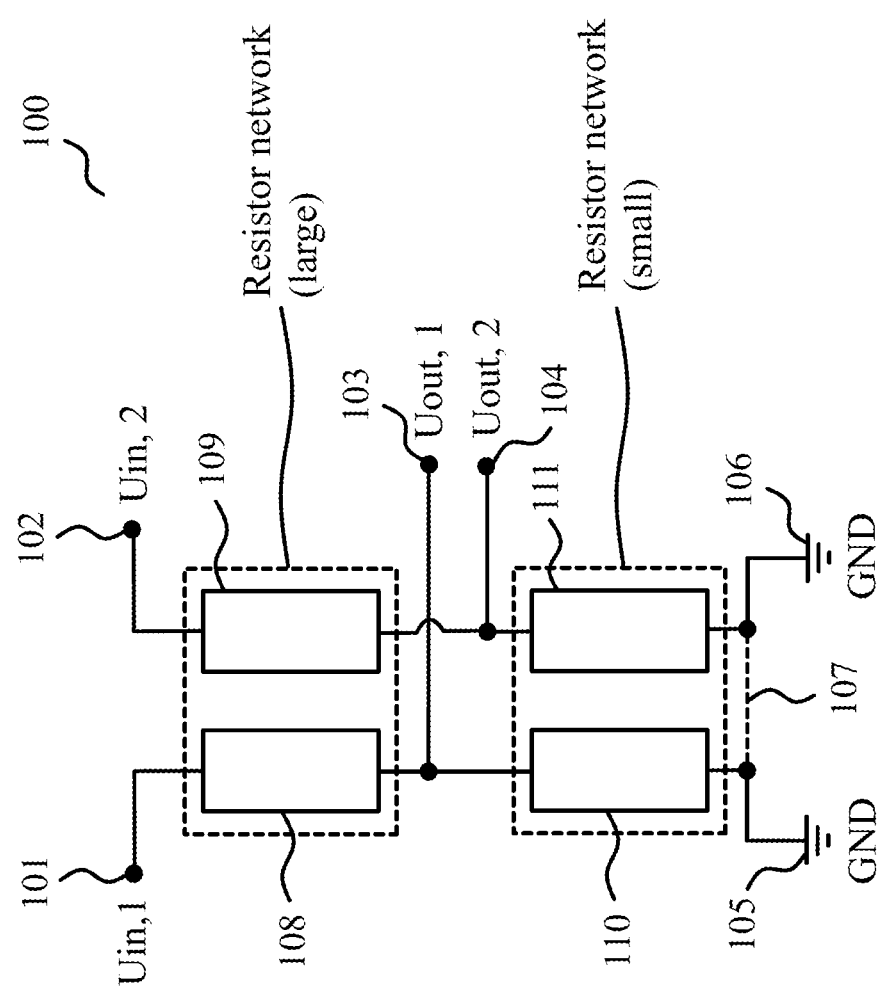

TEMPERATURE COMPENSATION CIRCUIT IN A VOLTAGE MEASUREMENT

CROSS-REFERENCE TO RELATED APPLICATIONS

This application claims priority benefit of Serial No. 20206363, filed Dec. 22, 2020 in Finland, and which application is incorporated herein by reference. To the extent appropriate, a claim of priority is made to the above-disclosed applications.

FIELD OF THE INVENTION

The present invention relates to processes involving voltage measurements where a changing temperature is affecting the measurements, and where the measured voltage is relatively large.

BACKGROUND OF THE INVENTION

Voltage measurements for large voltages may be performed with a dedicated voltage meter but because of a large magnitude of the voltage, it is more practical to convert a high voltage to a smaller voltage at first. This operation may be performed by a transformer. Also, there are voltage dividing circuits available which are based on a resistor network. The voltage loss over a single resistor is smaller than over a series-connected group of resistors, where the resistance value of a resistor affects the voltage loss over the resistor based on a formula U=RI (i.e. Ohms law).

In general, a changing temperature will affect the resistance value over a resistor. Therefore, there are measurement errors based on varying temperature values in a measurement configuration which involves at least one resistor, or other temperature sensitive component.

U.S. Pat. No. 5,926,778 ("Pöppel") discloses a method for temperature compensation in measuring systems. The related invention is from January 1997. Pöppel cites three different ways to compensate or handle the effect made by the (changing) temperature and the first way is to have an additional heating device (which can in some instances also have a cooling effect) or a cooling device (such as a fan), which will result in the electrical element or device being in the desired temperature where its behavior is well known. This has the problem of the accuracy in reaching the desired temperature, and also in selecting the right measurement time when the temperature of the resistor (or a respective temperature dependent element) has actually reached a steady state (i.e. a constant "inner" temperature). A second way mentioned in Pöppel is the determination of a temperature coefficient and utilize it later.

A third way of Pöppel is to determine a temperature-independent operating point, if there is one in the first place. Concerning the second method utilizing the temperature coefficient, Pöppel discusses in FIG. 1 a way of determining the instantaneous temperature coefficient. It is based on two measurements, performed before and after self-heating the temperature-dependent component. In other words, Pöppel achieves measurement results is two different temperatures, from which a temperature coefficient is determined. A defect of this simple method is that it assumes that the temperature-dependency is a linearly affecting parameter e.g. on the resistance, i.e. the temperature coefficient is constant for any two temperatures. This might not be true in all practical situations.

In prior art, an oven applying a constant temperature can also be used in compensating the effect of the changing temperatures across a wider temperature range. Placing the measurement assembly in the oven and tuning a desired temperature for the oven means that after the desired temperature has been reached and it can be assumed that all elements within the oven also have reached the desired temperature, the measurements can be commenced. The drawbacks for such an oven are that the stabilization time is long which means that practicality weakens and quick measurements are not possible to be obtained. Also, the constant temperature oven requires additional supply power which can be tricky in some measurement locations e.g. in a factory.

Thus, there is a need for a simple, and yet effective and quick method of taking care of the effect of different temperatures on at least one temperature-sensitive component, where a relatively large voltage value is desired to be accurately measured.

SUMMARY OF THE INVENTION

In a first aspect of the invention, an apparatus is disclosed, which is configured to determine a substantially large voltage value without a direct measurement. The apparatus is characterized to comprise:
  a first voltage divider comprising a first large resistor exceeding a given threshold value and a first small resistor being less than the given threshold value;
  a second voltage divider comprising a second large resistor exceeding a given threshold value and a second small resistor being less than the given threshold value;
  via an inputted reference voltage in the input of the second voltage divider, the apparatus is configured to measure a divided reference voltage over the second small resistor;
  a processor configured to calculate a transfer ratio of a voltage divider in a given ambient temperature; and
  the processor determined to calculate a substantially large voltage value from a measured divided voltage value and the calculated transfer ratio, in the given ambient temperature.

In a second aspect of the invention, a method is disclosed for determining a substantially large voltage value without a direct measurement. The method is characterized to comprise the steps of:
  feeding an inputted reference voltage in an input of a second voltage divider;
  measuring a divided reference voltage over the second small resistor;
  calculating a transfer ratio of a voltage divider in a given ambient temperature; and
  calculating a substantially large voltage value from a measured divided voltage value and the calculated transfer ratio, in the given ambient temperature.

In a third aspect of the invention, a computer program product (and a computer program as well) is introduced. The computer program product is for determining a substantially large voltage value without a direct measurement, wherein a computer program is stored in the computer program product and the computer program is executable in a processor. The computer program product is characterized in that the computer program comprises the following steps to be executed:
  feeding an inputted reference voltage in an input of a second voltage divider;

measuring a divided reference voltage over the second small resistor;

calculating a transfer ratio of a voltage divider in a given ambient temperature; and calculating a substantially large voltage value from a measured divided voltage value and the calculated transfer ratio, in the given ambient temperature.

Various different embodiments are disclosed in dependent claims and in the description below.

BRIEF DESCRIPTION OF THE DRAWINGS

FIG. 1 illustrates a first circuit diagram implemented in an embodiment of the present invention.

DETAILED DESCRIPTION OF THE INVENTION

The present invention discloses an apparatus and method for temperature compensation within a voltage measurement of a substantially large voltage. Also a computer program and a computer program product are aspects of the same invention.

The present invention is based on continuous, real-time compensation between similarly behaving electrical components.

The starting point of the present invention is that a relatively high voltage is desired to be accurately measured. This process may happen in cold or warm temperatures, ranging from −30 . . . +50° C. for example. In the present invention, a voltage division principle can be applied in a form of a voltage divider circuit. This is exemplified in a circuit diagram shown in FIG. 1.

The circuit 100 in this embodiment comprises two main parts: a large resistor network 108, 109 comprising large resistances, and a small resistor network 110, 111 comprising small resistances. The voltage $U_{in,\,1}$ 101 is an unknown, large voltage desired to be measured. It is desired to somehow lower this voltage for easier measurement in practice, so thus a voltage divider circuit of resistors 108 and 110 is applied. Because the resistance of resistor 108 is substantially larger than the resistance of resistor 110, the voltage available at point 103, i.e. $U_{out,\,1}$, is a much lower voltage to be measured than $U_{in,\,1}$ at point 101. The ground is at point 105.

Now the main idea behind the present invention is to have a reference circuit comprising a large resistor 109, a small resistor 111, and a known reference voltage $U_{in,\,2}$ at point 102. When a dividing point 104 is looked at, we obtain a divided reference voltage, i.e. $U_{out,\,2}$, which can be easily measured. In an ambient temperature $T_0$, the transfer ratio $F_2$ of the voltages is:

$$F_2 = \frac{U_{out,2}}{U_{in,2}} = \frac{R(111)}{R(109) + R(111)} \quad (1)$$

It is noted that this transfer ratio $F_2$ will not remain constant when the temperature changes.

Now the following step is to realize that resistance networks comprising large and small resistances will act mutually similarly as a function of changing temperatures, no matter what the incoming voltage $U_{in}$ is. In other words, for relatively large and small incoming voltages, the resistor network will act the same way as a function of temperature.

Thus, in an embodiment of the present invention, the resistors 108 and 109 can be selected as follows:

$$R(108) = R(109) \quad (2)$$

and respectively, resistors 110 and 111 can be selected, in an embodiment, as follows:

$$R(110) = R(111) \quad (3)$$

Thus, the following applies for circuit 1 in the same temperature $T_0$:

$$F_1 = \frac{U_{out,1}}{U_{in,1}} = \frac{R(110)}{R(108) + R(110)} = \frac{R(111)}{R(109) + R(111)} = F_2 \quad (4)$$

As a result, in ambient temperature $T_0$, the transfer ratio $F_1$ in circuit 1 is assumed to be the same as the transfer ratio $F_2$ in circuit 2, i.e.:

$$F_1 = F_2 \quad (5)$$

Because for the circuit 1, the following applies:

$$F_1 = \frac{U_{out,1}}{U_{in,1}}, \quad (6)$$

we can deduce the unknown parameter, i.e. the large input voltage to be measured as:

$$U_{in1} = \frac{U_{out,1}}{F_2} \quad (7)$$

Thus, by measuring a smaller, divided voltage $U_{out,\,1}$ from point 103, we are able to calculate $U_{in,\,1}$ without actually measuring it directly. $F_2$ can be calculated from equation (1) already.

The ground point for circuit 2 is 106. Ground port 106 can be mutually the same as ground point 105, in an embodiment. However, if a galvanic isolation is desired between circuits 1 and 2, the ground ports 105, 106 can be mutually isolated (shown as dashed line 107 between the two ports.

If the temperature changes from $T_0$, it is enough to measure the voltages from ports (points) 102 and 104, which results in $F_2$ ($T_x$) as:

$$F_2(T_x) = \frac{U_{out,2}}{U_{in,2}}, \text{ in temperature } T_x, \quad (8)$$

whereafter the output voltage in port 103 can be measured (i.e. $U_{out,\,1}$) in this temperature $T_x$.

Now, in the new temperature value $T_x$, the desired large voltage value will be:

$$U_{in1}(T_x) = \frac{U_{out,1}(T_x)}{F_2(T_x)} \quad (9)$$

As a summary, the effect of the changing temperature to the transfer ratio F can be notably large, but it does not hinder us to proceed with accurate determination of the high voltage value in port 101 as the algorithm in the above suggests. This is due to the fact that two similar voltage divider circuits will have the mutually same transfer ratio, no matter what the incoming voltage magnitude is, in all temperature values of a possible, feasible temperature range. In other words, in a certain temperature value $T_x$, $F_1$ will always be equal to $F_2$.

In an embodiment, the large voltage is defined to be larger than the maximum input voltage of the analog measurement circuit. In a practical situation and embodiment, a typical measurement range of the analog measurement circuit can be between 1-5 volts. In an embodiment, the present invention is thus suitable for measuring large voltages exceeding 5 V where the ambient temperature affecting the measurement might be changing.

In another embodiment, concerning the resistor network shown in FIG. 1, one, several or all shown resistors (108-111) can be implemented as a combination of at least two resistors. By this we mean that e.g. if resistor 108 is required to be 200 ohms, it can be obtained by a series connection of two 100 ohms' resistors. Also, a parallel connection can be used in this regard.

In another embodiment, a resistor network may comprise at least one shunt connection; i.e. at least one resistor being provided with a bypass path i.e. a short circuit.

Such a short circuit may be activated on a desired connection. In this manner, a larger resistor network may be used as a tunable resistor. In the example of the resistor 108 having a resistance value of 200 ohms with two series-connected 100 ohms resistors, either of these resistors can be provided with a shunt functionality. When activated, the 200 ohms resistor can be changed to a 100 ohms resistor through the short-circuiting of the other resistor in this series-connection for resistor 108.

An advantage of the present invention is that it allows determination of a dangerously large voltage without directly measuring it. The presented circuitry allows us to measure smaller voltages, and to calculate the desired voltage value from them. Furthermore, the presented algorithm and circuitry is fairly simple, allowing a fast calculation speed for the desired voltage. The presented algorithm allows to measure voltages in a large range, and it also allows to measure such voltages, no matter what the temperature is. Thus, there is a big operational freedom in the setup circumstances of the circuitry. As a further advantage, the present invention results in a fast measurement process. Also, the arrangement of the present invention does not require any additional power supply. Furthermore, the present invention has also a good long-term stability since the resistive components in the same casing change the same way over time.

The computer program may be implemented to run the method steps, when the method steps are written is a form of a computer code and executed in a processor. Also there can be a memory where the computer program code can be saved to. In an embodiment, a cloud service may comprise a server or computer, where the processor and memory are located. In that case, there can be data transmission and reception means so that the information can be transported between the voltage measurement location and the remote location in the cloud (or a nearby PC, for instance). The data transport can be performed wirelessly (in case of a remote control room), but a wired connection could also take place (in case of a nearby PC). In an embodiment, the processor and the memory are implemented within a voltage meter provided with several measurement ports for measuring the desired voltages.

The present invention is not restricted merely to the embodiments presented above but the present invention is defined by the scope of the claims.

The invention claimed is:

1. An apparatus configured to determine a voltage value without a direct measurement, wherein the apparatus comprises:
   a first voltage divider comprising a first large resistor having a first large resistor value exceeding a given threshold value and a first small resistor having a first small resistor value being less than the given threshold value;
   a second voltage divider comprising a second large resistor having a second large resistor value exceeding the given threshold value and a second small resistor having a second small resistor value being less than the given threshold value;
   wherein the apparatus is configured to measure a divided reference voltage over the second small resistor via an inputted reference voltage to an input of the second voltage divider;
   a processor configured to calculate a transfer ratio of the second voltage divider in a given ambient temperature, by dividing the second small resistor value by a sum of the second large resistor value and the second small resistor value;
   the processor configured to assume a transfer ratio of the first voltage divider to be the same as a transfer ratio of the second voltage divider, in the given ambient temperature; and
   the processor configured to calculate a voltage value from a first measured value of the divided reference voltage and the calculated transfer ratio, at the given ambient temperature, wherein the voltage value is connected to an input of the first voltage divider.

2. The apparatus according to claim 1, wherein the first voltage divider and the second voltage divider comprise comparable resistance values.

3. The apparatus according to claim 1, wherein a common ground connection is applied in both the first voltage divider and the second voltage divider.

4. The apparatus according to claim 1, wherein a separate ground connection is applied for the first voltage divider and the second voltage divider, respectively, for galvanic isolation of the first voltage divider and the second voltage divider.

5. The apparatus according to claim 1, wherein when the ambient temperature has changed, the apparatus is configured to recalculate the transfer ratio through the inputted reference voltage, and to apply that the transfer ratio is independent of a magnitude of the inputted reference voltage as a resistor network acts in a same way as a function of temperature.

6. The apparatus according to claim 1, wherein the voltage value is defined to be larger than a maximum input voltage of an analog measurement circuit.

7. The apparatus according to claim 1, wherein at least one resistor of a resistor network is implemented as a combination of at least two resistors, as a parallel or series connection.

8. The apparatus according to claim 1, comprising one or more shunt connections.

9. A method for determining a voltage value without a direct measurement, wherein the method comprises the steps of:
   feeding an inputted reference voltage to an input of a second voltage divider, wherein the second voltage divider comprises a second large resistor having a second large resistor value exceeding a given threshold value and a second small resistor having a second small resistor value being less than the given threshold value;

measuring a divided reference voltage over the second small resistor;

calculating a transfer ratio of the second voltage divider in a given ambient temperature by a processor, by dividing the second small resistor value by a sum of the second large resistor value and the second small resistor value;

assuming a transfer ratio of a first voltage divider to be the same as the transfer ratio of the second voltage divider by the processor, in the given ambient temperature, wherein the first voltage divider comprises a first large resistor having a first large resistor value exceeding the given threshold value and a first small resistor having a first small resistor value being less than the given threshold value; and calculating a voltage value from a first measured value of the divided references voltage and the calculated transfer ratio by the processor, at the given ambient temperature, wherein the voltage value is connected to an input of the first voltage divider.

10. A non-transitory computer program product for determining a voltage value without a direct measurement, wherein a computer program is stored in the non-transitory computer program product and the computer program is executable in a processor, wherein the computer program comprises the following steps to be executed:

feeding an inputted reference voltage in an input of a second voltage divider, wherein the second voltage divider comprises a second large resistor having a second large resistor value exceeding a given threshold value and a second small resistor having a second small resistor value being less than the given threshold value;

measuring a divided reference voltage over the second small resistor;

calculating a transfer ratio of the second voltage divider in a given ambient temperature by the processor, by dividing the second small resistor value by a sum of the second large resistor value and the second small resistor value;

assuming a transfer ratio of a first voltage divider to be the same as the transfer ratio of the second voltage divider by the processor, in the given ambient temperature, wherein the first voltage divider comprises a first large resistor having a first large resistor value exceeding the given threshold value and a first small resistor having a first small resistor value being less than the given threshold value; and calculating a voltage value from a first measured value of the divided reference voltage and the calculated transfer ratio by the processor, at the given ambient temperature, wherein the voltage value is connected to an input of the first voltage divider.

\* \* \* \* \*